(12) United States Patent
Ai

(10) Patent No.: US 11,145,694 B2
(45) Date of Patent: Oct. 12, 2021

(54) ELECTROLUMINESCENT DEVICE AND METHOD OF FABRICATING SAME

(71) Applicant: Shenzhen China Star Optoelectronics Semiconductor Display Technology Co., Ltd., Guangdong (CN)

(72) Inventor: Na Ai, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 69 days.

(21) Appl. No.: 16/621,245

(22) PCT Filed: Nov. 8, 2019

(86) PCT No.: PCT/CN2019/116726
§ 371 (c)(1),
(2) Date: Dec. 11, 2019

(87) PCT Pub. No.: WO2021/082059
PCT Pub. Date: May 6, 2021

(65) Prior Publication Data
US 2021/0126062 A1 Apr. 29, 2021

(30) Foreign Application Priority Data
Oct. 29, 2019 (CN) .......................... 201911040083.6

(51) Int. Cl.
| H01L 27/32 | (2006.01) |
| H01L 51/52 | (2006.01) |
| H01L 51/50 | (2006.01) |
| H01L 51/00 | (2006.01) |
| H01L 51/56 | (2006.01) |

(52) U.S. Cl.
CPC ...... *H01L 27/3227* (2013.01); *H01L 51/0005* (2013.01); *H01L 51/5056* (2013.01); *H01L 51/5072* (2013.01); *H01L 51/5092* (2013.01); *H01L 51/5284* (2013.01); *H01L 51/56* (2013.01)

(58) Field of Classification Search
CPC ............. H01L 27/3227; H01L 51/5092; H01L 51/5072
See application file for complete search history.

(56) References Cited

U.S. PATENT DOCUMENTS

| 2006/0227531 A1* | 10/2006 | Iou ........................ H01L 27/288 362/84 |
| 2009/0108757 A1* | 4/2009 | Lee ..................... H01L 51/5281 315/51 |
| 2011/0108856 A1* | 5/2011 | Wu ....................... H01L 27/288 257/80 |

FOREIGN PATENT DOCUMENTS

| CN | 106373984 A | 2/2017 |
| CN | 208284504 U | 12/2018 |
| TW | 200919758 A | 5/2009 |

* cited by examiner

*Primary Examiner* — Anthony Ho
(74) *Attorney, Agent, or Firm* — Mark M. Friedman

(57) ABSTRACT

The present invention relates to an electroluminescent device and a method of fabricating the same. The electroluminescent device includes a substrate, an organic photovoltaic cell unit (OPV) and a translucent organic light-emitting diode unit (OLED), wherein the organic photovoltaic cell unit is disposed on the substrate, the translucent organic light-emitting diode unit is disposed on the organic photovoltaic cell and connected in series with the organic photovoltaic cell.

8 Claims, 6 Drawing Sheets

| forming a patterned first electrode on the substrate; | — S21

sequentially depositing a first electrode modification layer, a first organic semiconductor light-absorbing layer, a second organic semiconductor light-absorbing layer, and a second electrode modification layer on the first electrode by vacuum evaporation, spin coating, or inkjet printing, wherein the first organic semiconductor light-absorbing layer and the second organic semiconductor light-absorbing layer constitute an organic semiconductor light-absorbing layer for absorbing light from visible light to infrared light; and | — S22

forming a translucent second electrode on the second electrode modification layer. | — S23

FIG. 3 forming a translucent second electrode on the organic photovoltaic cell; ⎯ S31

⇩ sequentially depositing a hole injection layer, a hole transport layer, a light-emitting layer, an electron transport layer, an electron injection layer on the second electrode by vacuum evaporation, spin coating, or inkjet printing; or sequentially depositing an electron injecting layer, an electron transporting layer, a light-emitting layer, a hole transporting layer, and a hole injecting layer on the second electrode by vacuum evaporation, spin coating, or inkjet printing; ⎯ S32

⇩ depositing a translucent third electrode on the electron injection layer or on the hole injection layer by vacuum evaporation; and ⎯ S33

⇩ depositing a cover layer on the third electrode. ⎯ S34

FIG. 4 forming a translucent second electrode on the organic photovoltaic cell unit; — S310 sequentially depositing an electron injection layer, an electron transport layer, a light-emitting layer, a hole transport layer, and a hole injection layer on the second electrode by vacuum evaporation, spin coating, or inkjet printing; — S320 depositing a translucent third electrode on the hole injection layer by vacuum evaporation; and — S330 depositing a cover layer on the third electrode. — S340

FIG. 6

ELECTROLUMINESCENT DEVICE AND METHOD OF FABRICATING SAME

BACKGROUND OF INVENTION

Field of Invention

The present invention relates to a field of display technologies, and in particular, to an electroluminescent device and a method of fabricating the same.

Description of Prior Art

Current active matrix organic light-emitting diode (AMOLED) display devices typically introduce polarizing plates and quarter-wave plates to improve contrast in order to achieve higher contrast. Sunlight becomes linearly polarized light when entering the screen polarizing plate, and becomes right-handed circularly polarized light after passing through the quarter-wave plate. When the light is reflected back from a bottom of the device, a direction of rotation changes and therefore cannot enter eyes through the screen. Meanwhile, the light emitted by the active matrix organic light-emitting diode itself is also attenuated by the polarizing plate. At present, transmittance of the polarizing plate is mostly between 45±3%, that is, most of the light emitted by the active matrix organic light-emitting diode is lost in vain, and introduction of the polarizing plates and the quarter-wave plates also increases fabricating costs.

Other solutions include use of black and non-reflective electrodes, such as carbon electrodes, but it also inevitably absorbs light from active-matrix organic light-emitting diodes while eliminating external light.

Therefore, there is an urgent need to provide a new electroluminescent device and a method of fabricating the same to overcome the problems in the prior art.

SUMMARY OF INVENTION

An object of the present invention is to provide an electroluminescent device and a method of fabricating the same, in which a translucent organic electroluminescent diode (OLED) unit and an organic photovoltaic (OPV) cell unit are stacked in series, a high contrast of the organic electroluminescent diode unit is realized by using characteristics of the organic photovoltaic cell unit to absorb light, and meanwhile, the absorbed light is converted into electric energy to realize recycling of light energy, thus beneficial to improving a use time of an external power source.

The present invention provides an electroluminescent device including a substrate, an organic photovoltaic cell, and a translucent organic light-emitting diode unit; in particular, the organic photovoltaic cell unit is disposed on the substrate, and the translucent organic light-emitting diode unit is disposed on the organic photovoltaic cell and connected in series with the organic photovoltaic cell.

Further, the organic photovoltaic cell unit includes: a first electrode, a first electrode modification layer, an organic semiconductor light-absorbing layer, a second electrode modification layer, and a second electrode. Specifically, the first electrode is disposed on the substrate, the first electrode modification layer is disposed on the first electrode, the organic semiconductor light-absorbing layer is disposed on the first electrode modification layer for absorbing light from visible light to infrared light, the second electrode modification layer is disposed on the organic semiconductor light-absorbing layer, and the second electrode is disposed on the second electrode modification layer.

Further, the organic semiconductor light-absorbing layer includes a first organic semiconductor light-absorbing layer and a second organic semiconductor light-absorbing layer, wherein the first organic semiconductor light-absorbing layer is disposed on the first electrode for absorbing visible light, and the second organic semiconductor light-absorbing layer is disposed on the first organic semiconductor light-absorbing layer for absorbing infrared light.

Further, the translucent organic light-emitting diode unit includes a second electrode, a light-emitting layer, and a third electrode, wherein the second electrode is disposed on the organic photovoltaic cell, and the light-emitting layer is disposed on the second electrode, and the third electrode is disposed on the light-emitting layer.

Further, the translucent organic light-emitting diode unit further includes a cover layer disposed on the third electrode; wherein the cover layer includes an optical coupling output material.

Further, the organic semiconductor light-absorbing layer includes a first organic semiconductor light-absorbing layer and a second organic semiconductor light-absorbing layer, wherein the first organic semiconductor light-absorbing layer is disposed on the first electrode for absorbing visible light, and the second organic semiconductor light-absorbing layer is disposed on the first organic semiconductor light-absorbing layer for absorbing infrared light.

Further, the translucent organic light-emitting diode unit includes a second electrode, a light-emitting layer, and a third electrode, wherein the second electrode is disposed on the organic photovoltaic cell, the light-emitting layer is disposed on the second electrode, and the third electrode is disposed on the light-emitting layer.

Further, the translucent organic light-emitting diode unit further includes a cover layer disposed on the third electrode; wherein the cover layer includes an optical exchange output material.

Further, the translucent organic light-emitting diode unit further includes a hole injection layer, a hole transport layer, the light-emitting layer, an electron transport layer, and an electron injection layer which are stacked. Specifically, the hole injection layer is provided on the second electrode, the hole transport layer is disposed on the hole injection layer, the light-emitting layer is disposed on the hole transport layer, the electron transport layer is disposed on the light-emitting layer, and the electron injection layer is disposed on the electron transport layer.

Further, the translucent organic light-emitting diode unit further includes a hole injection layer, a hole transport layer, the light-emitting layer, an electron transport layer, and an electron injection layer which are stacked. Specifically, the electron injection layer is disposed on the second electrode, the electron transport layer is disposed on the electron injection layer, the light-emitting layer is disposed on the electron transport layer, the hole transport layer is disposed on the light-emitting layer, and the hole injection layer is provided on the hole transport layer.

The present invention also provides a method of fabricating an electroluminescent device, including the steps of:
  providing a substrate;
  forming an organic photovoltaic cell on the substrate; and
  forming a translucent organic light-emitting diode unit on the organic photovoltaic cell, wherein the translucent organic light-emitting diode unit is connected in series with the organic photovoltaic cell.

Further, the step of forming the organic photovoltaic cell unit includes:

forming a patterned first electrode on the substrate;

sequentially depositing a first electrode modification layer, a first organic semiconductor light-absorbing layer, a second organic semiconductor light-absorbing layer, and a second electrode modification layer on the first electrode by vacuum evaporation, spin coating, or inkjet printing, wherein the first organic semiconductor light-absorbing layer and the second organic semiconductor light-absorbing layer constitute an organic semiconductor light-absorbing layer for absorbing light from visible light to infrared light; and forming a translucent second electrode on the second electrode modification layer.

Further, the step of forming the translucent organic light-emitting diode unit includes:

forming a translucent second electrode on the organic photovoltaic cell;

sequentially depositing a hole injection layer, a hole transport layer, a light-emitting layer, an electron transport layer, an electron injection layer on the second electrode by vacuum evaporation, spin coating, or inkjet printing; or sequentially depositing an electron injecting layer, an electron transporting layer, a light-emitting layer, a hole transporting layer, and a hole injecting layer on the second electrode by vacuum evaporation, spin coating, or inkjet printing;

depositing a translucent third electrode on the electron injection layer or on the hole injection layer by vacuum evaporation; and depositing a cover layer on the third electrode.

The present invention has the beneficial effects of providing an electroluminescent device and a method of fabricating the same, in which a translucent organic electroluminescent diode (OLED) unit and an organic photovoltaic (OPV) cell unit are stacked in series, a high contrast of the organic electroluminescent diode unit is realized by using characteristics of the organic photovoltaic cell unit to absorb light, and meanwhile, the absorbed light is converted into electric energy to realize recycling of light energy, thus beneficial to improving a use time of an external power source.

BRIEF DESCRIPTION OF DRAWINGS

FIG. 3 is a flow chart of fabricating an organic photovoltaic cell unit as illustrated in FIG. 2.

FIG. 4 is a flow chart of fabricating a translucent organic light-emitting diode unit as illustrated in FIG. 2.

FIG. 6 is a flow chart of fabricating a translucent organic light-emitting diode unit according to Embodiment 2 of the present invention.

Figure 1:
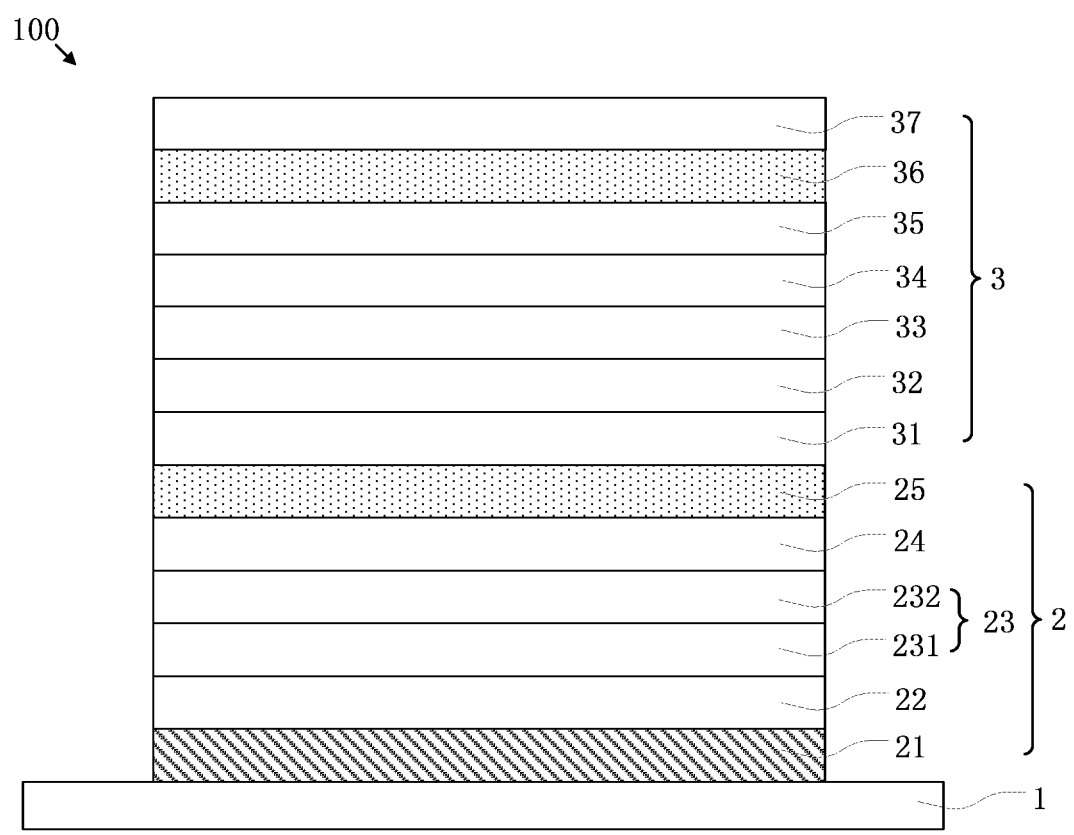
FIG. 1 is a schematic structural view of an electroluminescent device according to Embodiment 1 of the present invention.

Elements in the drawings are designated by reference numerals listed below.

1, substrate; 2, organic photovoltaic cell unit; 3, translucent organic light-emitting diode unit;

21, first electrode; 22, first electrode modification layer; 23, organic semiconductor light absorption layer;

231, first organic semiconductor light-absorbing layer; 232, second organic semiconductor light-absorbing layer;

24, second electrode modification layer; 25, second electrode; 31, hole injection layer;

32, hole transport layer; 33, light-emitting layer; 34, electron transport layer;

35, electron injection layer; 36, third electrode; 37, cover layer;

100. electroluminescent device.

DETAILED DESCRIPTION OF PREFERRED EMBODIMENTS

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

Embodiment 1

Referring to FIG. 1, an electroluminescent device 100 provided in Embodiment 1 of the present invention includes a substrate 1, an organic photovoltaic cell unit 2, and a translucent organic light-emitting diode unit 3. Specifically, the organic photovoltaic cell unit 2 is disposed on the substrate 1, and the translucent organic light-emitting diode unit 3 is disposed on the organic photovoltaic cell unit 2 and connected in series with the organic photovoltaic cell unit 2.

In this embodiment, the organic photovoltaic cell unit 2 includes a first electrode 21, a first electrode modification layer 22, an organic semiconductor light-absorbing layer 23, a second electrode modification layer 24, and a second electrode 2. Specifically, the first electrode 21 is disposed on the substrate 1; the first electrode modification layer 22 is disposed on the first electrode 21; the organic semiconductor light absorption layer 23 is disposed on the first electrode modification layer 22 for absorbing light from visible light to infrared light, such that high contrast of the organic electroluminescent diode unit is realized by absorbing light, and meanwhile, the absorbed light is converted into electric energy to realize recycling of light energy, thus beneficial to improving a use time of an external power source; a second electrode modification layer 24 is disposed on the organic semiconductor light-absorbing layer 23; and the second electrode 25 is disposed on the second electrode modification layer 24.

In this embodiment, the organic semiconductor light-absorbing layer 23 includes a first organic semiconductor light-absorbing layer 231 and a second organic semiconductor light-absorbing layer 232, wherein the first organic semiconductor light-absorbing layer 231 is disposed on the first electrode 21, the second organic semiconductor light-absorbing layer 232 is disposed on the first organic semiconductor light-absorbing layer 231 for absorbing infrared light.

In this embodiment, the translucent organic light-emitting diode unit 3 includes the second electrode 25, a light-emitting layer 33, and a third electrode 36, wherein the second electrode 25 is disposed on the organic photovoltaic cell unit 2, the second electrode 25 is an common electrode shared by the organic photovoltaic cell unit 2 and the translucent organic light-emitting diode unit 3, the light-emitting layer 33 is disposed on the second electrode 25, and the third electrode 36 is disposed on the light-emitting layer 33. Preferably, the third electrode 36 has a thickness of 10 nm to 200 nm. The second electrode 25 and the third electrode 36 are translucent to facilitate light transmission.

In this embodiment, the translucent organic light-emitting diode unit 3 further includes a hole injection layer 31, a hole transport layer 32, the light-emitting layer 33, an electron transport layer 34, and an electron injection layer 35 which are stacked. The hole injection layer 31 is disposed on the second electrode 25, or the electron injection layer 35 is disposed on the second electrode 25. Specifically, in an embodiment, the hole injection layer 31 is disposed on the second electrode 25, the hole transport layer 32 is disposed on the hole injection layer 31, the light-emitting layer 33 is disposed on the hole transport layer 32, the electron transport layer 34 is disposed on the light-emitting layer 33, and the electron injection layer 35 is disposed on the electron transport layer 34, wherein in this case, the third electrode 36 is disposed on the electron transport layer 34. In another embodiment, the electron injection layer 35 is disposed on the second electrode 25, the electron transport layer 34 is disposed on the electron injection layer 35, the light-emitting layer 33 is disposed on the electron transport layer 34, the hole transport layer 32 is disposed on the light-emitting layer 33, and the hole injection layer 31 is disposed on the hole transport layer 32, wherein in this case, the third electrode 36 is provided on the hole injection layer 31. That is, the translucent organic light-emitting diode unit 3 includes two types of arrangement, either upright or inverted.

In this embodiment, the translucent organic light-emitting diode unit 3 further includes a cover layer 37 disposed on the third electrode 36, wherein the cover layer 37 includes a light coupling output material for encapsulation, and the cover layer 37 preferably has a thickness of 20 nm to 200 nm.

Figure 2:
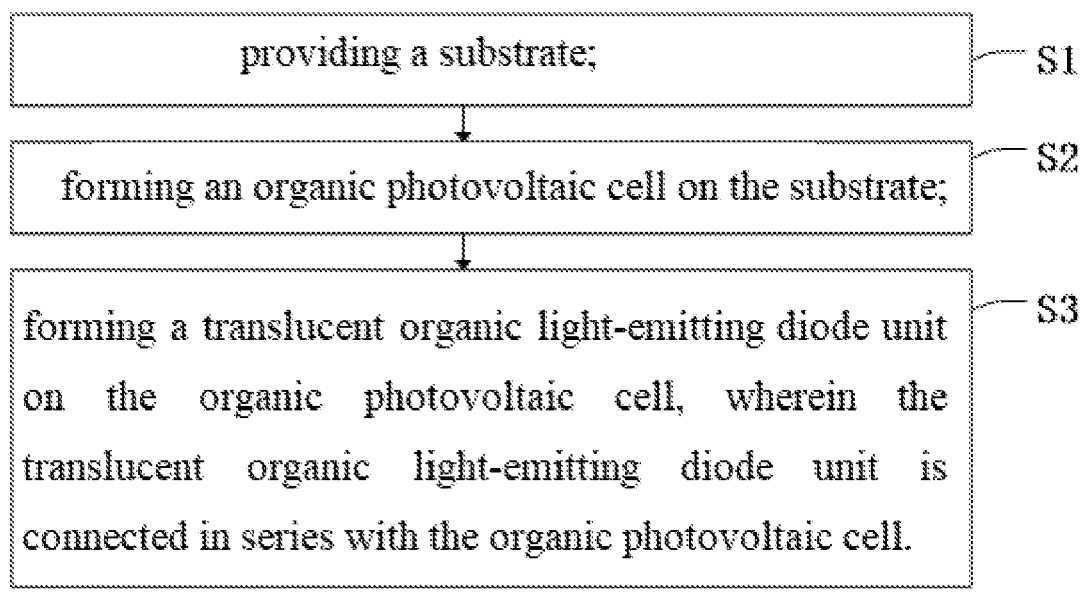
FIG. 2 is a flow chart of fabricating an electroluminescent device according to Embodiment 1 of the present invention.

Referring to FIG. 2, the present invention further provides a method of fabricating the electroluminescent device 100, including the following steps:

S1, providing a substrate 1;

S2, forming an organic photovoltaic cell unit 2 on the substrate 1;

S3, forming a translucent organic light-emitting diode unit 3 on the organic photovoltaic cell unit 2, wherein the translucent organic light-emitting diode unit 3 is connected in series with the organic photovoltaic cell unit 2.

Referring to FIG. 3, in this embodiment, the step of forming the organic photovoltaic cell unit includes the following steps:

S21, forming a patterned first electrode 21 on the substrate 1;

S22, sequentially depositing a first electrode modification layer 22, a first organic semiconductor light absorption layer 231, a second organic semiconductor light absorption layer 232, and a second electrode modification layer 24 on the first electrode 21 by vacuum evaporation, spin coating, or inkjet printing, wherein the first organic semiconductor light-absorbing layer 231 and the second organic semiconductor light-absorbing layer 232 constitute an organic semiconductor light-absorbing layer 23; and S23, forming a translucent second electrode 25 on the second electrode modification layer 24.

The first organic semiconductor light-absorbing layer 231 is configured to absorb visible light, the second organic semiconductor light-absorbing layer 232 is configured to absorb infrared light; and therefore, and the organic semiconductor light-absorbing layer 23 is configured to absorb light from visible light to infrared light, such that high contrast of the organic electroluminescent diode unit is realized by absorbing light, and meanwhile, the absorbed light is converted into electric energy to realize recycling of light energy, thus beneficial to improving a use time of an external power source.

Referring to FIG. 4, in this embodiment, the step of forming the translucent organic light-emitting diode unit includes the following steps:

S31, forming a translucent second electrode 25 on the organic photovoltaic cell unit 2;

S32, sequentially depositing a hole injection layer 31, a hole transport layer 32, a light-emitting layer 33, an electron transport layer 34, and an electron injection layer 35 on the second electrode 25 by vacuum evaporation, spin coating, or inkjet printing;

S33, depositing a translucent third electrode 36 on the electron injection layer 35 by vacuum evaporation, wherein preferably, the third electrode 36 has a thickness of 10 nm to 200 nm; and S34, depositing a cover layer 37 on the third electrode 36, wherein the cover layer 37 includes a light-coupling output material for encapsulation. Preferably, the cover layer 37 has a thickness of 20 nm to 200 nm.

Embodiment 2

Figure 5:
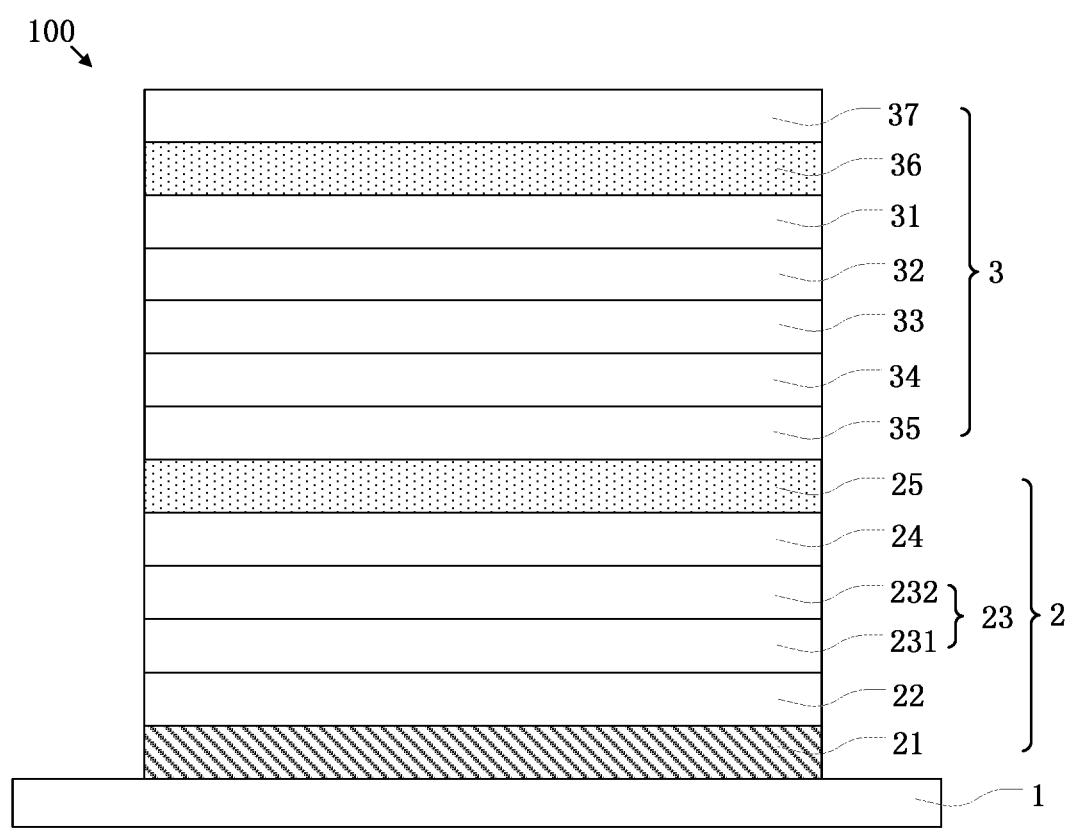
FIG. 5 is a schematic structural view of an electroluminescent device according to Embodiment 2 of the present invention.

Referring to FIG. 5, most of the technical features in Embodiment 1 are included in Embodiment 2, except that an electron injection layer 35 in Embodiment 2 is disposed on a second electrode 25, whereas in Embodiment 1, the hole injection layer 31 is provided on the second electrode 25. That is, the translucent organic light-emitting diode unit 3 includes two types of arrangement, either upright or inverted.

In Embodiment 2, in the translucent organic light-emitting diode unit 3, the electron injection layer 35 is disposed on the second electrode 25, the electron transport layer 34 is disposed on the electron injection layer 35, the light-emitting layer 33 is disposed on the electron transport layer 34, the hole transport layer 32 is disposed on the light-emitting layer 33, the injection layer 31 is provided on the hole transport layer 32, and the third electrode 36 is provided on the hole injection layer 31.

In Embodiment 2, a method of fabricating the electroluminescent device 100 is the same as that in Embodiment 1. For details, please refer to relevant contents of FIG. 2.

In Embodiment 2, steps of fabricating the organic photovoltaic cell unit 2 are the same as those in Embodiment 1. For details, please refer to relevant contents of FIG. 3.

Referring to FIG. 6, in Embodiment 2, the fabricating of the translucent organic light-emitting diode unit 3 includes the following steps:

S310, forming a translucent second electrode 25 on the organic photovoltaic cell unit 2;

S320, sequentially depositing an electron injection layer 35, an electron transport layer 34, a light-emitting layer 33, a hole transport layer 32, and a hole injection layer 31 on the second electrode 25 by vacuum evaporation, spin coating, or inkjet printing;

S330, depositing a translucent third electrode 36 on the hole injection layer 31 by vacuum evaporation, wherein the third electrode 36 preferably has a thickness of 10 nm to 200 nm; and S340, depositing a cover layer 37 on the third electrode 36, wherein the cover layer 37 includes a light-coupling output material for encapsulation. Preferably, the cover layer 37 has a thickness of 20 nm to 200 nm.

The present invention has the beneficial effects of providing an electroluminescent device and a method of fabricating the same, in which a translucent organic electroluminescent diode (OLED) unit and an organic photovoltaic (OPV) cell unit are stacked in series, a high contrast of the organic electroluminescent diode unit is realized by using characteristics of the organic photovoltaic cell unit to absorb light, and meanwhile, the absorbed light is converted into electric energy to realize recycling of light energy, thus beneficial to improving a use time of an external power source.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An electroluminescent device, comprising:
   a substrate;
   an organic photovoltaic cell unit disposed on the substrate; and
   a translucent organic light-emitting diode unit disposed on the organic photovoltaic cell and connected in series with the organic photovoltaic cell,
   wherein the organic photovoltaic cell unit comprises:
      a first electrode disposed on the substrate;
      a first electrode modification layer disposed on the first electrode;
      an organic semiconductor light-absorbing layer disposed on the first electrode modification layer for absorbing light from visible light to infrared light;
      a second electrode modification layer disposed on the organic semiconductor light-absorbing layer; and
      a second electrode disposed on the second electrode modification layer.

2. The electroluminescent device according to claim 1, wherein the organic semiconductor light-absorbing layer comprises:
   a first organic semiconductor light-absorbing layer disposed on the first electrode for absorbing visible light; and
   a second organic semiconductor light-absorbing layer disposed on the first organic semiconductor light-absorbing layer for absorbing infrared light.

3. The electroluminescent device according to claim 1, wherein the translucent organic light-emitting diode unit comprises:
   a second electrode disposed on the organic photovoltaic cell unit;
   a light-emitting layer disposed on the second electrode; and
   a third electrode disposed on the light-emitting layer.

4. The electroluminescent device according to claim 3, wherein the translucent organic light-emitting diode unit further comprises:
   a cover layer disposed on the third electrode.

5. The electroluminescent device according to claim 3, wherein the translucent organic light-emitting diode unit further comprises:
   a hole injection layer disposed on the second electrode;
   a hole transport layer disposed on the hole injection layer;
   the light-emitting layer disposed on the hole transport layer;
   an electron transport layer disposed on the light-emitting layer; and
   an electron injection layer disposed on the electron transport layer.

6. The electroluminescent device according to claim 3, wherein the translucent organic light-emitting diode unit further comprises:
   an electron injection layer disposed on the second electrode;
   an electron transport layer disposed on the electron injection layer;
   the light-emitting layer disposed on the electron transport layer;
   a hole transport layer disposed on the light-emitting layer; and
   a hole injection layer disposed on the hole transport layer.

7. A method of fabricating an electroluminescent device, comprising the following steps:
   providing a substrate;
   forming an organic photovoltaic cell on the substrate; and
   forming a translucent organic light-emitting diode unit on the organic photovoltaic cell,
   wherein the translucent organic light-emitting diode unit is connected in series with the organic photovoltaic cell,
   wherein the step of forming the organic photovoltaic cell unit comprises:
      forming a patterned first electrode on the substrate;
      sequentially depositing a first electrode modification layer, a first organic semiconductor light-absorbing layer, a second organic semiconductor light-absorbing layer, and a second electrode modification layer on the first electrode by vacuum evaporation, spin coating, or inkjet printing, wherein the first organic semiconductor light-absorbing layer and the second organic semiconductor light-absorbing layer constitute an organic semiconductor light-absorbing layer for absorbing light from visible light to infrared light; and
      forming a translucent second electrode on the second electrode modification layer.

8. The method of fabricating the electroluminescent device according to claim 7, wherein the step of forming the translucent organic light-emitting diode unit comprises:
   forming a translucent second electrode on the organic photovoltaic cell;
   sequentially depositing a hole injection layer, a hole transport layer, a light-emitting layer, an electron transport layer, an electron injection layer on the second electrode by vacuum evaporation, spin coating, or inkjet printing; or sequentially depositing an electron injecting layer, an electron transporting layer, a light-emitting layer, a hole transporting layer, and a hole injecting layer on the second electrode by vacuum evaporation, spin coating, or inkjet printing;

depositing a translucent third electrode on the electron injection layer or on the hole injection layer by vacuum evaporation; and depositing a cover layer on the third electrode.

\* \* \* \* \*